United States Patent [19]

Nishizawa et al.

[11] Patent Number: 4,574,310
[45] Date of Patent: Mar. 4, 1986

[54] ONE-DIMENSIONAL SEMICONDUCTOR IMAGING DEVICE

[75] Inventors: Jun-ichi Nishizawa, No. 6-16, Komegafukuro 1-chome, Sendai-shi, Miyagi; Takashige Tamamushi, Miyagi, both of Japan

[73] Assignee: Jun-ichi Nishizawa, Miyagi, Japan

[21] Appl. No.: 561,110

[22] Filed: Dec. 13, 1983

[30] Foreign Application Priority Data

Dec. 13, 1982 [JP] Japan .................. 57-218586

[51] Int. Cl.$^4$ ............................. H04N 3/12
[52] U.S. Cl. ..................... 358/212; 357/24; 250/578
[58] Field of Search ............... 358/212, 213; 357/24 LR, 22, 43; 250/578

[56] References Cited

U.S. PATENT DOCUMENTS

| | | | |
|---|---|---|---|
| 4,236,829 | 12/1980 | Chikamura et al. | 357/16 |
| 4,317,127 | 2/1982 | Nishizawa | 357/42 |
| 4,326,209 | 4/1982 | Nishizawa et al. | 357/22 |
| 4,338,618 | 7/1982 | Nishizawa | 357/43 |
| 4,462,047 | 7/1984 | Fujimoto et al. | 358/212 |
| 4,518,863 | 5/1985 | Fukuoka et al. | 250/578 |

Primary Examiner—Gene Z. Rubinson
Assistant Examiner—Robert G. Lev
Attorney, Agent, or Firm—Sughrue, Mion, Zinn, Macpeak & Seas

[57] ABSTRACT

A one-dimensional semiconductor imaging device in which each pixel in a linear array of devices is composed of but one transistor. The single transistor is an SIT (Static Induction Transistor) including a pair of principal electrode regions of one conduction type formed facing one another through a highly resistive channel region, and first and second gate regions of the other conduction type formed in contact with the channel region to control the current flowing between the two principal electrode regions. A transparent electrode is formed on at least one part of the first gate electrode through a capacitor. One of the two principal electrode regions, which are both common to all pixels, is connected to a video signal output terminal through a switch. The first gate region of each SIT is connected to a dedicated output through a capacitor.

3 Claims, 11 Drawing Figures

ONE-DIMENSIONAL SEMICONDUCTOR IMAGING DEVICE

BACKGROUND OF THE INVENTION

The present invention relates to one-dimensional semiconductor imaging device. More particularly, the invention relates to a semiconductor imaging device composed of a one-dimensional array of pixels, each implemented with an SIT (Static Induction Transistor) having both light-detecting and switching capabilities.

The conventional one-dimensional semiconductor imaging device uses pixels each composed of a light-detecting diode and a separate switching MOS transistor. With such a pixel, the output signal level and the device sensitivity are low. This low sensitivity of pixels puts a limit on the number of pixels that can be packed into the available area of the imaging device, hence limiting the resolution of the device.

In view of this, the primary object of the present invention is to provide fast-operating one-dimensional semiconductor imaging device of a simple configuration wherein one pixel is formed with only one transistor but which has an increased light amplification gain, and hence produces a larger output current per unit pixel.

SUMMARY OF THE INVENTION

This object of the present invention is achieved by a semiconductor imaging device including a linear (one-dimensional) array of pixels, each composed of an SIT which includes a pair of principal electrode regions composed of two semiconductor regions of one conduction type arranged facing each other through a channel region made of high resistivity semiconductor material, and first and second gate regions made of semiconductor material of the other conduction type formed in contact with the channel region so as to control the current flowing between the two principal electrode regions.

A transparent electrode is formed on at least part of the first gate electrode through a capacitor. Charge carriers generated by light excitation accumulate in the first gate region so as effect control over the current flowing between the two principal electrodes. One of the two principal electrode regions which is common to all pixels is connected to a video signal output terminal through a switch. The output terminal is in turn connected to one terminal of a video power supply through a load resistor. The other principal electrode region and the second gate region are also common to all pixels. The first gate region of each SIT is independently connected to a different output of a scanning circuit through a capacitor.

The above object of the present invention can also be achieved by a semiconductor imaging device including a linear arrangement of pixels, each composed of an SIT which includes a pair of principal electrode regions made of two semiconductor regions of one conduction type arranged facing each other through a channel region made of high resistivity semiconductor material, and first and second gate regions of the other conduction type formed in contact with the channel region so as to control the current flowing between the two principal electrode regions. A transparent electrode is formed on at least part of the first gate electrode through a capacitor. Charge carriers generated by light excitation accumulated in the first gate region effect control over the current flowing between the two principal electrodes. One of the two principal electrode regions which is common to all pixels is connected to a video signal output terminal through a switch. The output terminal is connected to one terminal of a video power supply through a load resistor. The other principal electrode region and the second gate region are also common to all pixels. The first gate region of each SIT is independently connected to a different output of a scanning circuit through a capacitor. The device is also provided with means for regulating the potential across the second gate region. This regulating means includes a switching element for extracting carriers accumulated within the second gate region, and has as one principal electrode the second gate region, and as the other principal electrode a semiconductor region with a high impurity concentration which extends in the array direction of the pixels.

DESCRIPTION OF THE PREFERRED EMBODIMENTS

Figure 1:
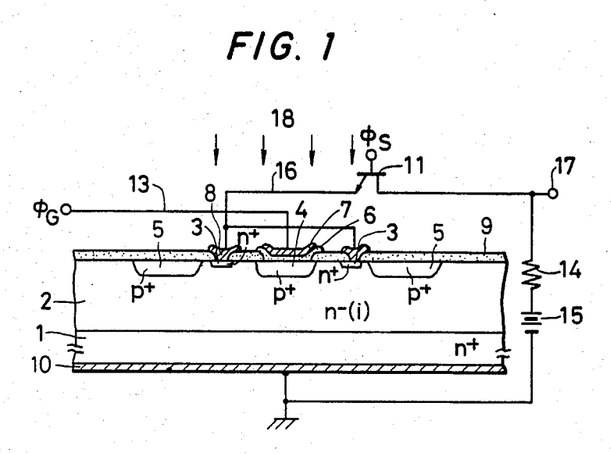
FIGS. 1, 3B, 6 and 8 show in cross section essential parts of four different embodiments of a pixel that is used in a one-dimensional semiconductor imaging device of the present invention.

A cross section of a preferred embodiment of a pixel that is used in a one-dimensional semiconductor imaging device of the present invention is shown in FIG. 1. In this Figure, reference numeral 1 represents an Si substrate of the $n^+$ type; 2 is a highly resistive layer of the $n^-$ type (or an intrinsic semiconductor region); 3 is a drain region of the $n^+$ type having a high impurity concentration; 4 is a first gate (control gate) region of the $p^+$ type having a high impurity concentration; 5 is a second gate (shielding gate) region of the $p^+$ type having a high impurity concentration; 8 is a drain electrode, 10 is a source electrode; 6 is an insulating film made of $SiO_2$, $Si_3N_4$, etc; 7 is a control gate electrode; 9 is a surface protective film made of $SiO_2$, etc.; 11 is a switching transistor; $\phi_S$ is a transistor control signal; 13 is a selection line over which a read pulse voltage $\phi_G$ is applied to the control gate electrode 7 from a pixel selecting circuit (not shown); 14 is a load resistance; 15 is a video voltage source, 17 is an output terminal; and 18 indicates incident light. The shielding gate 5 is electrically floated or applied with a constant voltage from biasing circuit. The function of the shielding gate is to isolate two adjacent pixels by a depletion layer.

In order to fabricate an SIT, the impurity concentration in the highly resistive region 2 that serves as a channel should not exceed about $1 \times 10^{16}$ cm$^{-3}$, whereas the impurity concentration in each of the gate, source and drain should exceed about $1 \times 10^{18}$ cm$^{-3}$. In order to prevent the generation of a drain current when the gate voltage is zero, the dimensions and impurity concentrations should be selected so that the diffusion potential alone is sufficient to form a depletion layer between the two gates and in the channel.

Figure 2:
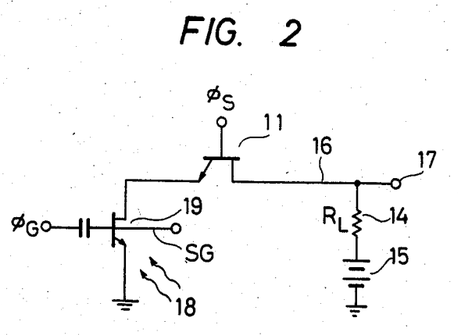
FIG. 2 is an equivalent circuit diagram of FIG. 1.

The equivalent circuit of the device of FIG. 1 is shown in FIG. 2. Upon illumination with light 18, holes generated by light excitation flow into the gate region of an SIT 19 to thus cause an active light signal to be generated. A pulsive voltage $\phi_S$ is applied to the base (or gate) of the transistor 11 to turn it on, whereupon a bias voltage is applied to the transistor 19 from the video voltage source 15; however, the pulsive voltage $\phi_G$ is not then applied. When $\phi_G$ is applied to turn on the transistor 19, a drain current flows in a magnitude according therefore to the intensity of incident light 18, and a light signal is obtained at the output terminal 17. The optical output at the terminal 17 varies with the intensity of the incident light 18 so as to provide a wide dynamic range. The gain of light amplification with this arrangement has been found to be approximately $10^3$, which is at least ten times as great as the gain achieved by the conventional bipolar transistor. A capacitor is connected to the gate of transistor 19 which is used to block the passage of a d.c. component of the photocarrier current.

According the first embodiment of the present invention, a plurality of unit pixels having the cross section shown in FIG. 1 are arranged one dimensionally, and a common shielding gate 5 is provided to isolate the respective pixels by a depletion layer. In addition to the shielding gate 5, the drain region 3 and source region 10 (but not the control gate 4) are common to all pixels in the one-dimensional array. In spite of this simple configuration, the individual unit pixels work as independent transistors and provide a large output current with a wider frequency response than in the conventional imaging device.

Figure 3A:
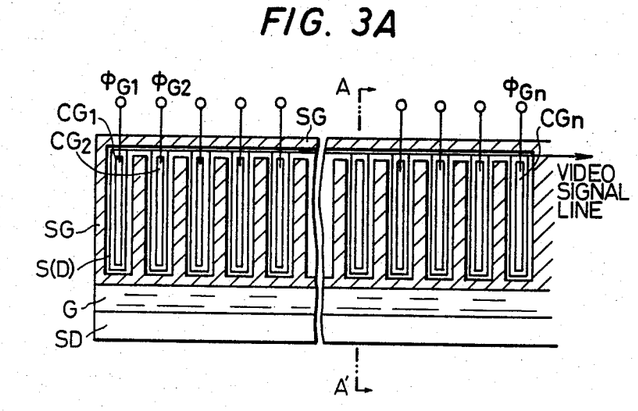
FIG. 3A is a plan view of a device shown in cross section in FIG. 3B.

Another embodiment of a one-dimensional semiconductor imaging device of the present invention will hereunder be described with reference to FIGS. 3A through 4. FIG. 3A is a plan view showing the essential parts of a one-dimensional semiconductor imaging device having a light-receiving section configured so as to pack pixels at a very small spacing. In this Figure, CG$_1$ to CG$_n$ are control gates, SG is a shielding gate, S(D) is source (drain), G is a gate region, SD is a source or drain, and $\phi_{G1}$ to $\phi_{Gn}$ are reading pulse signals. One control gage (CG$_1$ to CG$_n$) and the source (drain) S(D) and the shielding gate SG on both sides of the control gate make up a single pixel. A plurality of such pixels are arranged one-dimensionally in a line.

The source or drain S(D) of each pixel is connected to a video signal line. The control gates CG$_1$ to CG$_n$ of the pixels are independent of each other. The other principal electrode (drain or source) of each pixel is not shown in FIG. 3 but is common to all pixels. The pixels are provided with a gate region G and source or drain SD extending along the side in the longitudinal direction of the one-dimensional semiconductor imaging device. A switching element is thereby formed having the shielding gate SG as one principal electrode (source or drain) and the source or drain SD as the other principal electrode and which drains off carriers from the shielding gate SG through the gate region G in the direction perpendicular to the longitudinal direction of the one-dimensional semiconductor imaging device. For rapid depletion of carriers, this switching element is preferably composed of an SIT capable of high speed operation (high frequency response). If desired, the switching element may be made of an MOS transistor or other suitable device.

Figure 3B:
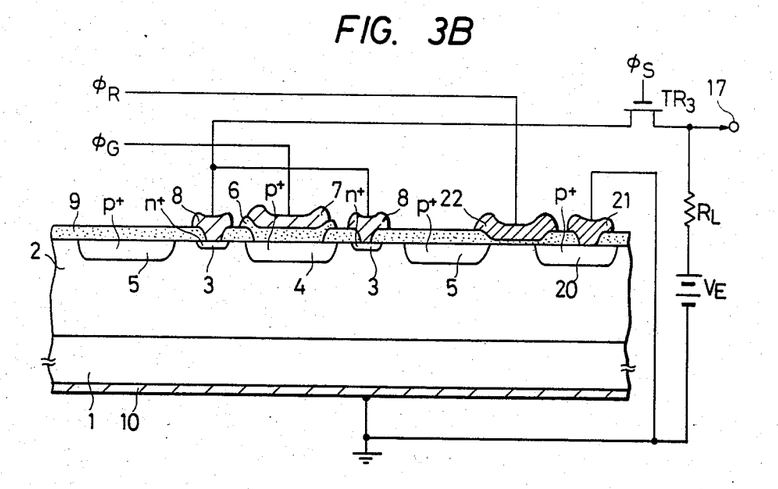

FIG. 3B is a cross section of the essential parts of FIG. 3A taken along a line A—A', wherein like numerals identify like parts. In FIG. 3B, 20 indicates a source or drain region of the p$^+$ type, 21 is a source or drain electrode, and 22 is a gate electrode. The shielding gate 5 and the p$^+$ type region 20 form source and drain regions, which provide a channel in the n$^-$ layer directly beneath the gate electrode 22 in response to a voltage $\phi_R$ applied to that electrode.

Figure 5:
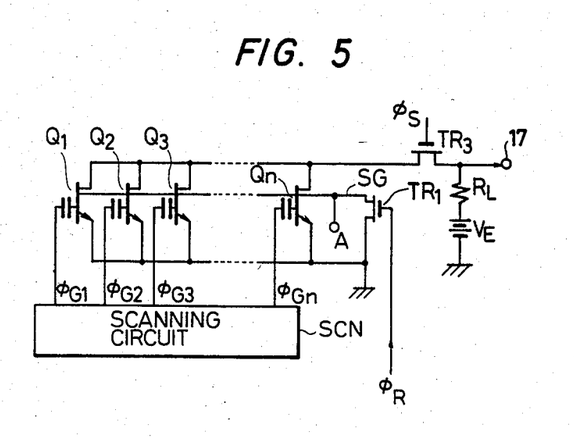
FIG. 5 is an equivalent circuit diagram of the device shown in both FIG. 3A and FIG. 4.

The operation of the device shown in FIGS. 3A and 3B will hereunder be described with reference to the circuit diagram of FIG. 5. In FIG. 5, Q$_1$ to Q$_n$ represent pixels, TR$_1$ is a transistor having a p$^+$ region 20 as a source and a p$^+$ region (shielding gate) 5 as a drain, and which is capable of draining off carriers from the shielding gate, $\phi_R$ indicates a pulse signal for driving the latter transistor, TR$_3$ is a switching element such as transistor connected in the video signal line, R$_L$ is a load resistor, V$_E$ is a video voltage source, SCN is a scanning circuit, and $\phi_{G1}$ to $\phi_{Gn}$ are readout pulses applied to the control gates of the respective pixels.

When the transistor TR$_3$ turns on, the output voltage of the video voltage source V$_E$ is applied across the source and drain of each pixel through the load resistor R$_L$ so as to energize the video signal readout line. Upon illumination with light, holes are accumulated in the capacitor connected to the gate of each of the pixels Q$_1$ to Q$_n$. The SIT forming each pixel is so designed that it remains off even if holes are accumulated in the capacitor. When readout pulses are applied in a suitable order, for example, in the order of $\phi_{G1}, \phi_{G2} \ldots \phi_{Gn}$, a video signal is obtained having an instantaneous magnitude determined by the amount of carriers accumulated in the respective pixels. More specifically, the control gates of the pixels Q$_1$ to Q$_n$ are supplied with readout pulses of the same voltage, but if the amount of carriers accumulated in the control gate differs from one pixel to another, the potential at the true gate point formed in the channel layer 2 between the drain electrode 3 and source electrode 10 also varies from one pixel to another. The resulting variation in the effective resistance between the source and drain causes variations in the video voltage appearing at the output terminal 17. In other words, an output signal according to the amount of light received by each pixel is obtained over the common video line in response to the pulses applied to the pixels.

When readout pulse signals $\phi_{G1}$ to $\phi_{Gn}$ have been applied consecutively so as to complete the readout from one line of pixels, the next cycle of application of scanning pulses is started after the drive pulse signal $\phi_R$ is applied to charge clearing transistor TR$_1$ so as to reset the potential at the shielding gate of each pixel to a predetermined level.

The readout gate pulse signals $\phi_{G1}$ to $\phi_{Gn}$ must have pulses which are sufficiently positive so that, when a respective signal is applied to the control gate electrode 7, photocarriers (holes) accumulated in the control gate region of the p$^+$ type directly under that electrode are discharged to the source electrode 10 through the adjacent channel region 2. Upon application of these readout signals, the potential at the control gate is reduced and the width of the depletion layer that has pinched off the channel between source and drain is increased to an extent that depends on the amount of the accumulated photocarriers. As a result, an amplified source-drain output current is obtained having a magnitude determined by the number of accumulated photocarriers. When the readout pulse signals are applied, the photocarriers are discharged from the control gate region to refresh the latter for effecting destructive readout.

Alternatively, pulses which are insufficient to discharge the photocarriers from the control gate region 4 of the p+ type may be applied as readout gate pulse signals. After completion of readout from, for instance, one line of pixels, the control gate region may be refreshed in preparation for the next cycle of carrier accumulation. This can be accomplished by the following method.

In FIG. 5, point A is downstream of the common shielding gate SG which serves as the drain of the charge clearing transistor $TR_1$. Another switching transistor is connected to this point A at its drain terminal. The source terminal of this additional transistor is grounded through a suitable d.c. power supply in such a manner, that when this transistor turns on, the shielding gate SG is negatively biased. The gate of this transistor is supplied with a pulse of a control gate refreshing signal $\phi_{R2}$ which is separate from the charge clearing signal $\phi_{R1}$ so as to keep the shielding gate region negatively biased for a period until the photocarriers have been discharged from the control gate (indicated at 4 in FIG. 3B) into the shielding gate region 5 through the highly resistive region 2 of the $n^-$ (or intrinsic) type. Thereafter, a pulse of the control signal $\phi_R$ is applied to turn on the transistor $T_R$, whereupon unwanted photocarriers in the shielding gate that have been read out of the pixels are discharged to ground through the transistor $TR_1$ at the desired time. This separate control over the potential at the shielding gate between the readout mode and refresh mode is effective for repeating the scanning cycle while holding the photocarriers in the control gate region for a suitable period of time after reading out the video signals from the pixels. Needless to say, the shielding gate is cleared of photocarriers by the transistor $TR_1$ in order to achieve the following two objects: (1) to regulate the width of the depletion layer only by the amount of photocarriers accumulated in the control gate so as to obtain an output current according to the amount of the photocarriers accumulated; and (2) preventing an undesired change in the potential at the shielding gate in the read-out mode that would affect the width of the depletion layer and which could even lead to an increase in the output current, irrespective of the amount of accumulated photocarriers.

As described in the foregoing, the semiconductor imaging device according to the present invention includes a one-dimensional array of pixels in which the source, drain and shielding gate are common to all pixels and only the control gate where light is received is a discrete element for each pixel. Nevertheless, the device ensures very effective isolation beteween signals read out of the respective pixels.

Figure 3C:
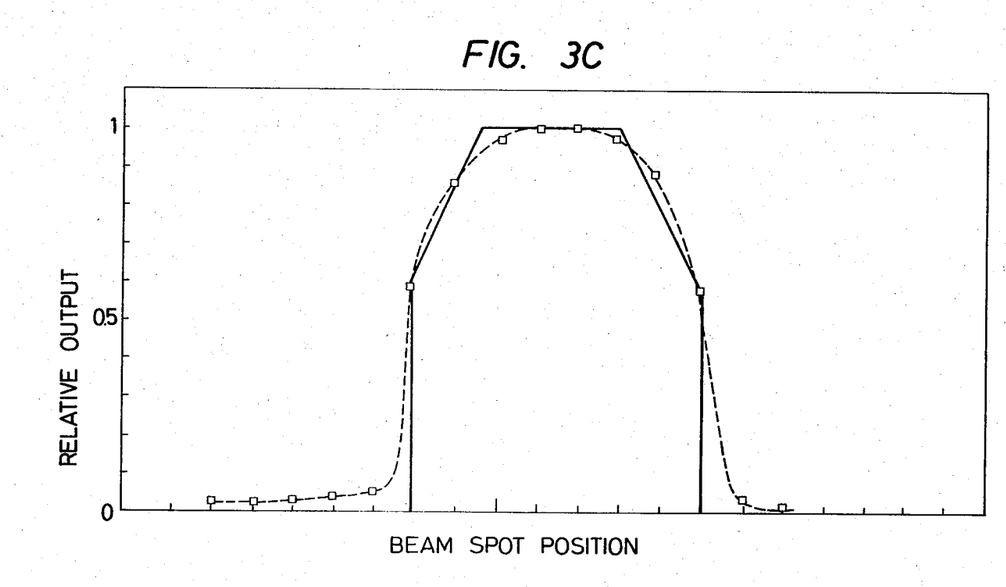
FIG. 3C is a graph showing the signal separation performance of a specific pixel used in the device of FIG. 3A.

In order to evaluate the performance of the imaging device of the present invention, the inventors fabricated a line sensor composed of eight pixels arranged in a row as shown in FIG. 3A, each of which measured 25 microns by 2,500 microns. The sensor was scanned with a light beam spot (diameter of about 200 microns) in the longitudinal direction. The output from the sixth pixel was plotted against the spot position, and the results are shown in the graph of FIG. 3C, wherein the horizontal axis is calibrated in divisions of 25 microns (the spacing between each pixel). The solid line indicates the outputs as calculated from a sensor having idealized isolation characteristics, and the dashed line indicates the measured values. The plot of the calculated values is angular because of the out-of-roundness of the beam spot used. As the graph shows, the sixth pixel receives a varying amount of light as the beam spot scans the line sensor, but the characteristics of its output closely approximate the theoretical values.

Figure 3D:
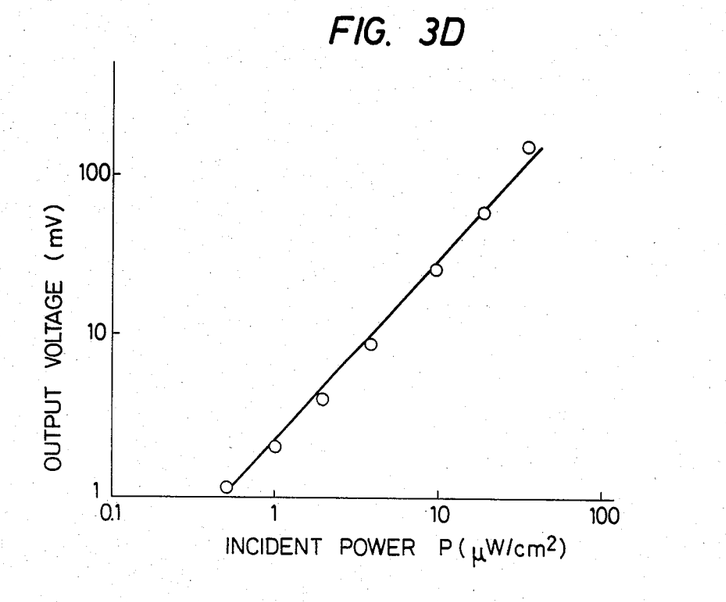
FIG. 3D is a graph showing the photodynamic characteristics of the pixel of the invention.

Using the same sixth pixel, a measurement of the dynamic characteristics of the device was conducted under the following conditions: wavelength of incident light=6550 Å, light storage time=10 msec, and readout pulse $\phi_G=0.8$ volt for 1 microsec. The results are shown in the graph of FIG. 3D from which it can be seen that the device of the present invention has a high sensitivity to light and provides a dynamic range extending from as low as 1 mV to as high as 100 mV or more.

Figure 4:
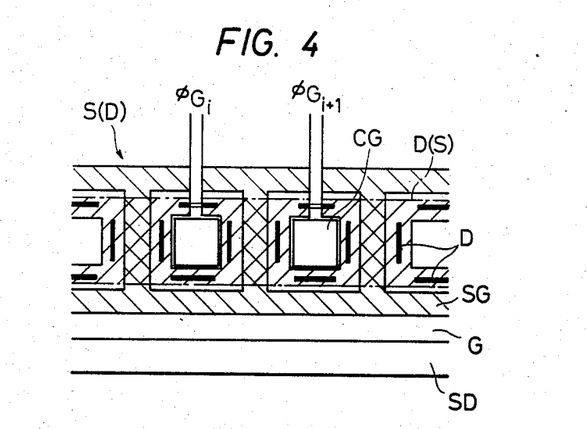
FIG. 4 is a plan view showing essential parts of another embodiment of a device of the present invention.

FIG. 4 is a plan view showing another embodiment of a one-dimensional semiconductor imaging device of the invention, here having a planar configuration that differs from the embodiment shown in FIGS. 3A to 3D. The unit pixels shown in FIG. 4 are square and are arranged one-dimensionally. In FIG. 4, CG is a light-receiving control gate, D(S) is a drain (source), SG is a shielding gate, S(D) is a source (drain) provided on the back side (not shown) of the substrate, G is a gate, SD is a source or drain which is one electrode of the clearing transistor, and $\phi_{Gi}$ and $\phi_{Gi+1}$ are readout pulse signals applied to a transparent electrode connected electrically to the control gate CG.

As shown, the four sides of each control gate are substantially surrounded by four drain regions D. These drain regions are isolated from each other at the four corners of each square pixel. Each drain region is shorter than the sides of the control gate. At the corners of each pixel, the channel between the control gate and the surrounding shielding gate is wider than the channel in other areas, and may be out of the pinched-off condition established by depletion layer. With this configuration, a leakage current will flow. This problem can be effectively prevented by the configuration of FIG. 4, but not so effectively as in the embodiment of FIG. 3A wherein the control gate is shown to be completely surrounded by the drain region. According to a preferred modification, four discrete drain regions isolated within the wafer at the corners of each pixel are arranged to substantially surround the control gate. These drain regions are electrically connected by an electrode formed on the surface of the wafer.

Figure 7:
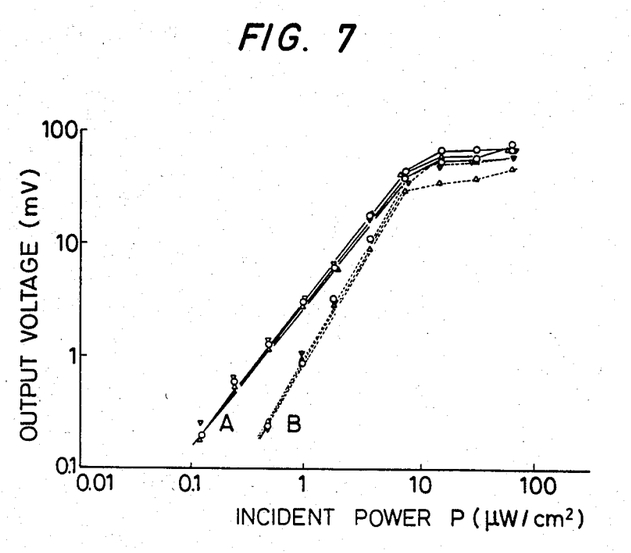
FIG. 7 is a graph comparing the photodynamic characteristics of the device of the present invention with those of a unit pixel used in a conventional two-dimensional semiconductor imaging device.

The one-dimensional semiconductor imaging device of the present invention produces linear output voltages with respect to higher intensities of light. In order to demonstrate this fact, the output characteristics of the device of the present invention were compared with those of a two-dimensional semiconductor imaging device using typical SITs. The results of this comparison are shown in FIG. 7. The testing conditions were the same as in the measurement for the data shown in FIG. 3D: wavelength of incident light=6550 Å and light storage time=10 msec. In FIG. 7, symbols A and B indicate device parameters.

Referring back to FIG. 5, the scanning circuit SCN is preferably composed of a fast operating shift register such as may be constructed with SIT logic. Needless to say, the scanning circuit may be so designed as to perform sequential readout or random access readout. The scanning circuit SCN, the transistor TR$_3$ and the transistor for controlling the potential at the point A in FIG. 5 may be formed on the same semiconductor substrate as the pixels.

According to an experiment conducted with the one-dimensional semiconductor imaging device of the present invention, the reading rate of the device is determined substantially by the time constant of the signal readout line 17, namely the product of the video line resistance R$_L$ and the junction capacitance C$_{DS}$ between source and drain. By making R$_L$ 1 kilo-ohm and C$_{DS}$ about 10 pF, signals could be read from each pixel at a rate of 10 nsec (1 kilo-ohm×10 pF). It is therefore concluded that the imaging device of the present invention is suitable for use in measurements that require scanning speeds faster than the speed needed for television.

Figure 6:
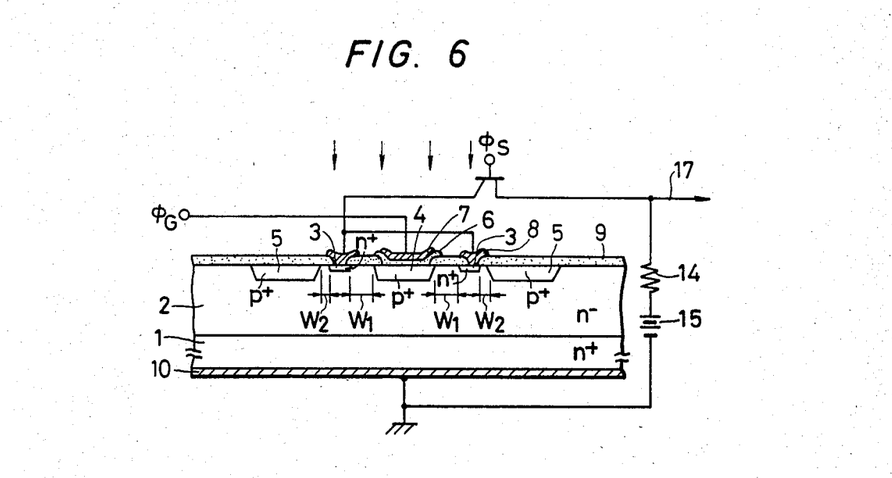
Figure 8:
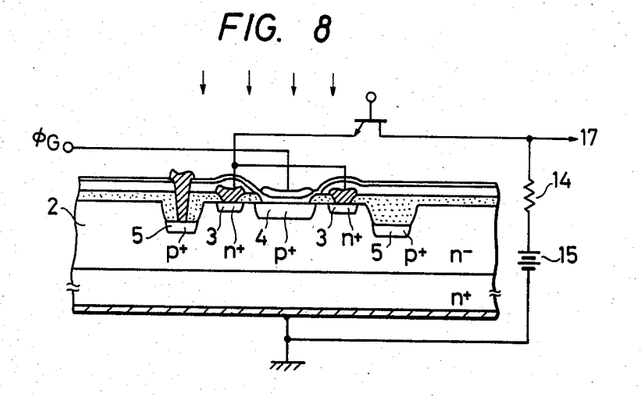

Other embodiments of a pixel that can be used in the one-dimensional semiconductor imaging device of the present invention are shown in FIGS. 6 and 8, which depict in cross section the essential parts of the pixel. The embodiment of FIG. 6 is so designed that the distance W$_1$ between the control gate region 4 having a high concentration of p$^-$ type impurity ($1\times10^{17}$ cm$^{-3}$) and the drain region 3 is greater than the distance W$_2$ between the shielding gate region 5, also having a high concentration of p$^+$ type impurity ($1\times10^{17}$ cm$^{-3}$) and the drain egion 3.

With the SIT shown in cross section in FIG. 1, W$_1$ is substantially equal to W$_2$, and photocarriers are accumulated in both the control gate and shielding gate at substantially equal rates. Therefore, voltage changes occurring at the two gates are expected to make substantially the same contribution to the signal current flowing between source and drain. This is because the diffusion potential V$_{b1}$ across the control gate 4 and drain 3 is substantially equal to the diffusion potential V$_{b2}$ across the shielding gate 5 and the drain 3, and upon illumination with light signal 18, there occurs a substantially equal drop in the potential barrier at the two gates with respect to the drain 3. As a result, even if the shielding gate is floating, the drop in the potential barrier causes equal magnitudes of photoelectric current to flow in the channel region between the shielding gate and drain and in the channel between the control gate and drain, making it impossible to fix the potential at the shielding gate with respect to the channel 2. However, according to the configuration shown in FIG. 6, the diffusion potential across the control gate 4 and drain region 3 is lower than that across the shielding gate 5 and drain region 3, and the resulting decrease in the photo-sensitivity of the shielding gate minimizes the problem of the unfixed potential at the shielding gate with respect to the channel 2. A more effective way is to making the impurity concentration in the shielding gate about ten times that in the control gate.

In order to prevent the entrance of light from above the shielding gate, a mask made of Al or any other material capable of shielding light may be formed on the gate 5. The impurity concentration in each of the substrate 1 and the n$^+$ region 3 is preferably as high as possible, typically about 10$^{17}$ to 10$^{22}$ cm$^{-3}$. The channel region 2 should not have an impurity concentration higher than 10$^{16}$ cm$^{-3}$, and may in fact be formed of n$^-$ type or intrinsic semiconductor material. The impurity concentration in each of the control gate 4 and the shielding gate 5 is generally about 10$^{17}$ to 10$^{22}$ cm$^{-3}$. From a process view point, a configuration where W$_1$ is less than W$_2$ with no difference in the impurity concentration in the two gates is the simplest design to fabricate.

The channel region 2 is formed in the n$^+$ type substrate 1 by, for example, vapor growth using SiCl$_4$ and H$_2$ gas. The gate regions 4 and 5 and the n$^+$ type region 3 are formed by conventional selective diffusion or ion implantation of boron or phosphorus, or by selective diffusion of B- or P-doped polycrystalline silicon. The capacitor connected to the control gate region is formed of a layer of SiO$_2$, Si$_3$N$_4$, Al$_2$O$_3$, AlN or a combination thereof. Electrodes 8, 7 and 10 are formed by vacuum deposition of Al or Al-Si.

Another embodiment of the pixel used in the imaging device of the present invention is shown in FIG. 8, wherein the diffusion potential V$_{bi(S)}$ between the shielding gate region 5 and the drain region 3 is made higher than the diffusion potential V$_{bi(C)}$ between the control gate region 4 and the drain region 3 by forming the shielding gate region at a position deeper in the wafer than the control gate region. Because of this positional relationship, V$_{bi(S)}$ becomes higher than V$_{bi(C)}$ (with respect to the drain region). More effective signal separation between pixels can therefore be accomplished by the shielding gate. The surface of the shielding gate 5 and the nearby channel region may be overlaid with a light-shielding layer of Al or other suitable material. This film permits only the control gate 4 and the nearby area to be illuminated with incident light, with the result that the potential at the shielding gate is retained at a substantially constant level, irrespective of the intensity of light. This feature, coupled with the appropriate choice of depth of the shielding gate, increases the effect of the shielding gate to isolate adjacent pixels.

The shielding gate can be diffused deeply into the wafer by the following procedure. First, only the shielding gate region is formed by selective diffusion of boron. Then, an oxide film is formed by photolithography in the area where the control gate is to be formed. Finally, the control gate region is formed by selective diffusion of boron. In the embodiment of FIG. 8, both the shielding gate and control gate have an impurity concentration in the range of 10$^{17}$ to 10$^{22}$ cm$^{-3}$, whereas the n$^+$ type drain 3 and substrate 1 have an impurity concentration of 10$^{18}$ cm$^{-3}$ or more. Another method of making V$_{bi(S)}$ greater than V$_{bi(C)}$ is to make the impurity concentration in the channel region 2 around the shielding gate region at least ten times higher than the impurity concentration in the channel region around the control gate region 4.

The foregoing description of the preferred embodiments of the invention assumes an n type channel device, but it should be understood that the concept of the present invention is also valid if the channel is p type. In the described embodiments, the video voltage source is connected to the n$^+$ type layer 3 on the gate side with the n$^+$ type substrate 1 grounded. However, it should also be understood that the video voltage may be applied to the electrode 10 on the substrate side with the n$^+$ layer 3 on the gate side grounded.

As will be apparent from the foregoing description, the present invention provides a linear sensor composed of a one-dimensional arrangement of pixels each implemented as an SIT having two gates, one a control gate and the other a shielding gate. In addition to the feature of one transistor for one pixel, the line sensor of the present invention achieves a high gain of light amplification and produces a high output per unit pixel. Furthermore, the inventive line sensor can be easily fabricated in compact form, permitting many pixels to be packed on one chip and ensuring high-speed operation. As another feature, a switching element for clearing the shielding gate of unwanted photocarriers which uses the shielding gate as one principal electrode is provided along the length of the line sensor. Therefore, the pixels can be cleared of excess photocarriers both rapidly and uniformly. This is also advantageous for the high-speed operation of the device.

We claim:

1. A semiconductor device comprising a linear array of pixels each comprising a static induction transistor comprising: a pair of principal electrode regions comprising two semiconductor regions of one conduction type arranged facing each other through a channel region made of high resistivity semiconductor material; first and second gate regions comprising semiconductor regions of the other conduction type formed in contact with said channel region for to controlling current flow between said two principal electrode regions; and a transparent electrode formed on at least one part of said first gate electrode through a capacitor, carriers generated by light excitation being accumulated in said first gate region so as to effect control over current flowing between said two principal electrodes, one of said two principal electrode regions being common to all pixels and being connected to a video signal output terminal through a switch, said output terminal being connected to one terminal of a video power supply through a load resistance, the other principal electrode region and said second gate region being common to all pixels, said first gate region of each static induction transistor being independently connected to a different output of a scanning circuit through a capacitor.

2. A semiconductor device comprising: a linear array of pixels each comprising a static induction transistor comprising: a pair of principal electrode regions made of two semiconductor regions of one conduction type arranged facing each other through a channel region made of high resistivity semiconductor material; first and second gate regions of the other conduction type formed in contact with said channel region for controlling current flow between said two principal electrode regions; a transparent electrode formed on at least part of said first gate electrode through a capacitor, carriers generated by light excitation being accumulated in said first gate region so as to effect control over current flowing between said two principal electrodes, one of said two principal electrode regions being common to all pixels and being connected to a video signal output terminal through a switch, said output terminal being connected to one terminal of a video power supply through a load resistance, the other principal electrode region and said second gate region being common to all pixels, said first gate region of each static induction transistor being independently connected to a different output of a scanning circuit through a capacitor, said device being also provided with means for regulating a potential across said second gate region, said regulating means including a switching element for clearing carriers accumulated within said second gate region and having as one principal electrode said second gate region and as another principal electrode a semiconductor region having a high impurity concentration extending in the direction of said array of said pixels.

3. The semiconductor device according to claim 2, wherein said potential regulating means has connected thereto one principal electrode of a switching transistor for refreshing said first gate by discharging carriers accumulated in said second gate, and a d.c. supply being connected so that bias is applied to said second gate through said transistor, wherein said refreshing switching transistor is driven independently of said clearing switching element.

* * * * *